United States Patent
Chiu (10) Patent No.: US 12,418,231 B2
(45) Date of Patent: Sep. 16, 2025

(54) INDUCTIVE CURRENT SENSOR, CONSTANT PEAK CURRENT CIRCUIT AND DC-DC CONVERSION APPARATUS

(71) Applicant: NUVOTON TECHNOLOGY CORPORATION, Hsinchu (TW)

(72) Inventor: Ching-Yen Chiu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 266 days.

(21) Appl. No.: 17/972,895

(22) Filed: Oct. 25, 2022

(65) Prior Publication Data

US 2023/0188025 A1      Jun. 15, 2023

(30) Foreign Application Priority Data

Dec. 13, 2021   (TW) ................................. 110146545

(51) Int. Cl.
*H02M 3/156*   (2006.01)
*H02M 1/00*    (2006.01)

(52) U.S. Cl.
CPC ....... *H02M 1/0009* (2021.05); *H02M 1/0022* (2021.05); *H02M 3/156* (2013.01)

(58) Field of Classification Search
CPC ............ H02M 1/0009; H02M 1/0003; H02M 1/4225; H02M 3/015; H02M 3/155; H02M 3/33507; H02M 3/00; H02M 3/33523; H02M 3/07; H02M 3/1582; H02M 3/33592; H02M 3/157; H02M 3/3353; H02M 3/156
See application file for complete search history.

(56) References Cited

FOREIGN PATENT DOCUMENTS

| CN | 109742946 B | * | 8/2020 | |
| WO | WO-2011079629 A1 | * | 7/2011 | ........ H02M 3/33507 |

OTHER PUBLICATIONS

CN 109742946 Translation (Year: 2020).*
WO 2011079629 A1 Translation (Year: 2011).*

* cited by examiner

*Primary Examiner* — Bryan R Perez
(74) *Attorney, Agent, or Firm* — Muncy, Geissler, Olds & Lowe, P.C.

(57) ABSTRACT

An inductive current sensor is used for a constant peak current circuit of a DC-DC conversion apparatus and has a sampling unit, a voltage-voltage conversion unit and an input voltage compensation unit. The sampling unit is used to receive a feedback voltage and an input voltage and generate a sampling voltage proportional to the feedback voltage accordingly, and the feedback voltage is related and inversely proportional to an inductor current by the DC-DC conversion apparatus. The voltage-voltage conversion unit is electrically connected to the sampling unit to receive the sampling voltage and the input voltage, and generate a sensing voltage inversely proportional to the sampling voltage accordingly. The input voltage compensation unit is electrically connected to the voltage-voltage conversion unit for receiving the input voltage to provide an initial voltage level of the sensing voltage, and the initial voltage level is proportional to the input voltage.

8 Claims, 6 Drawing Sheets

INDUCTIVE CURRENT SENSOR, CONSTANT PEAK CURRENT CIRCUIT AND DC-DC CONVERSION APPARATUS

CROSS-REFERENCE TO RELATED APPLICATION

This application claims the priority from the TW Patent Application No. 110146545, filed on Dec. 13, 2021 and all contents of such TW Patent Application are included in the present disclosure.

BACKGROUND

1. Field of the Invention

The present disclosure relates to an inductive current sensor used for a constant peak current circuit of a DC-DC conversion apparatus, in particular to, an inductive current sensor capable of making a peak value of an inductor current generated by a DC-DC conversion apparatus not vary with different input voltages.

2. Description of the Related Art

Usually, a constant peak current circuit is used in a switched DC-DC conversion apparatus, so that an inductor current output by the DC-DC conversion apparatus is expected to have a constant peak value. However, when the input voltage varies significantly, a peak value of the inductor current output by the DC-DC conversion apparatus will vary significantly. For instance, two different circuitries may use the input voltages of 1.6 volts and 3.6 volt respectively, and the peak values of the inductor currents output by the DC-DC conversion apparatus corresponding to the input two different voltages will be significantly different from each other. Therefore, the constant peak current circuit designed for a circuitry with an input voltage of 1.6 volts cannot be directly used for a circuitry with an input voltage of 3.6 volts.

Figure 1:
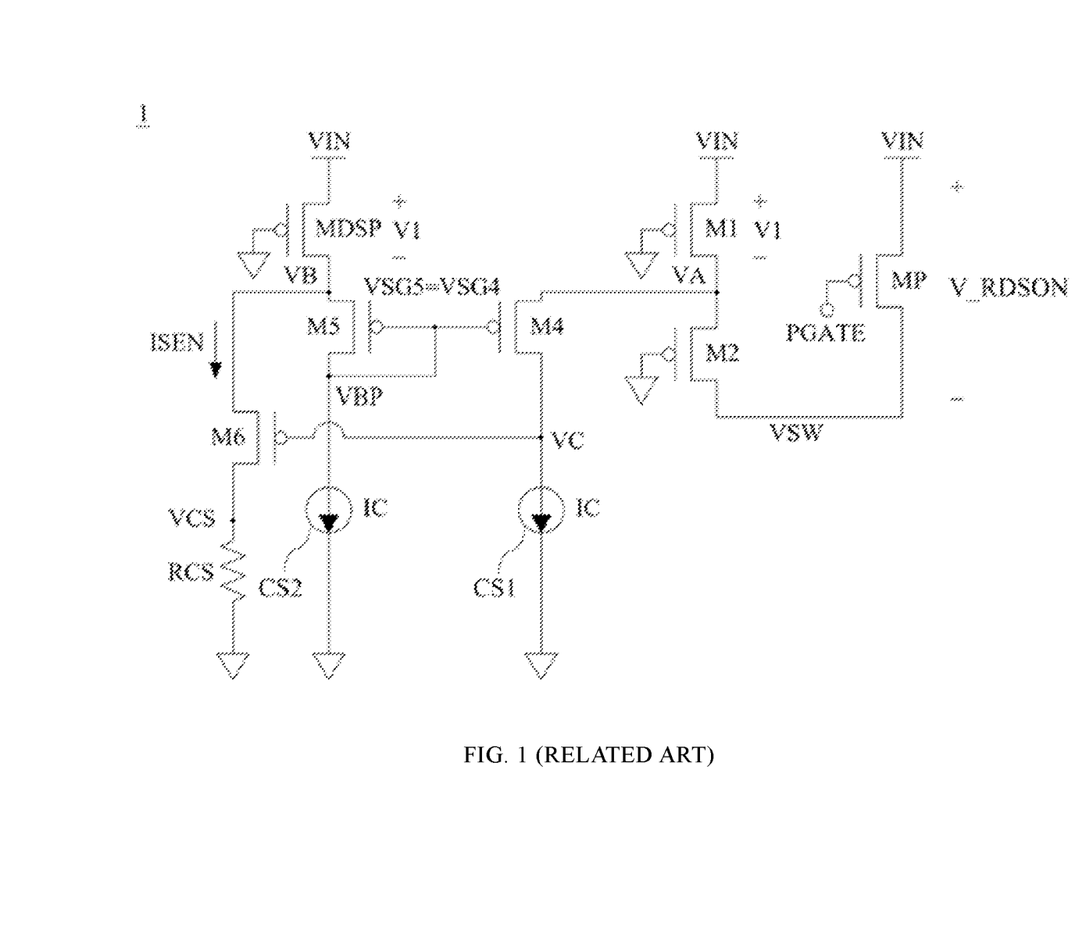
FIG. 1 is a circuit diagram of an inductive current sensor of the prior art.

Referring to FIG. 1, FIG. 1 is a circuit diagram of an inductive current sensor of the prior art. In the prior art, a constant peak current circuit comprises an inductive current sensor 1 and a comparator (not shown in drawings). The comparator is electrically connected to the inductive current sensor 1 to receive a sensing voltage VCS of the inductive current sensor 1, and compare the sensing voltage VCS and a reference voltage VREF, so as to output a triggering signal for regulating an inductor current generated by a DC-DC conversion apparatus (for example, a buck converter, but the present disclosure is not limited thereto).

The inductive current sensor 1 comprises a plurality of transistors MP, M1, M2, M4, M5, M6, MDSP, a resistor RCS and two current sources CS1 and CS2. A gate control signal PGATE is configured to control the inductive current sensor 1 to be turned on or off. In the off state, the transistors MP, M1, M2 and MDSP are turned on, so a sampling voltage VA and a voltage VC at the internal nodes are reset to high voltages (for example, an input voltage VIN), and voltages VB and VBP at the internal nodes are reset to a low voltage (for example, a ground voltage). In the on state, the transistor MP is turned off and transistors M1, M2 and MDSP are turned on. Then, the sampling voltage VA and the voltages VB, VC and VBP are established. Moreover, there on-resistors in the transistors MP, M1 and MDSP when the transistors MP, M1 and MDSP are turned on. Hence, the transistor MP has a voltage V_RDSOM between a source and a drain of the transistor MP, the transistor M1 has a voltage V1 between a source and a drain of the transistor M1, and the transistor MDSP has the voltage V1 between a source and a drain of the transistor MDSP.

Further, the sampling voltage VA is established due to the on-resistors of the transistors M1 and M2. The voltage VB will track the sampling voltage VA through a common-gate comparator formed by the transistor M4 and M5. The voltage VBP is risen to an operating voltage through a current IC provided by the current source CS2. The sampling voltage VA, the voltages VB and VBP at the nodes are risen to the operating voltage, and the inductive current sensor 1 starts to sense the inductor current. When the inductor current increases, a feedback voltage VSW decreases, and the sampling voltage VA decreases with the feedback voltage VSW in proportional to the ratio of the on-resistors of the transistors M1 and M2. The voltage VC decreases with the decrease of the sampling voltage VA through the transistor M4. As the voltage VC decreases, the transistor M6 is turned on to charge the resistor RCS gradually through an inductor current ISEN to generate the sensing voltage VCS. Finally, the comparator compares the sensing voltage VCS with the reference voltage VREF to regulate the peak value of the inductor current generated by the DC-DC conversion apparatus.

When the inductor current is much higher than the current IC, the sensing voltage VCS can be expressed as $VCS = (\alpha IL - IC) \cdot RCS$, and $\alpha = \{(W2/L2)/[(W1/L1)+(W2/L2)]\} \cdot (RDSON/RDSP)$. IL is a current value of the inductor current. W1 is a channel width of the transistor M1, and L1 is a channel length of the transistor M1. RDSON is the on-resistor of the transistor MP, and RDSP is the on-resistor of the transistor MDSP.

Figure 2:
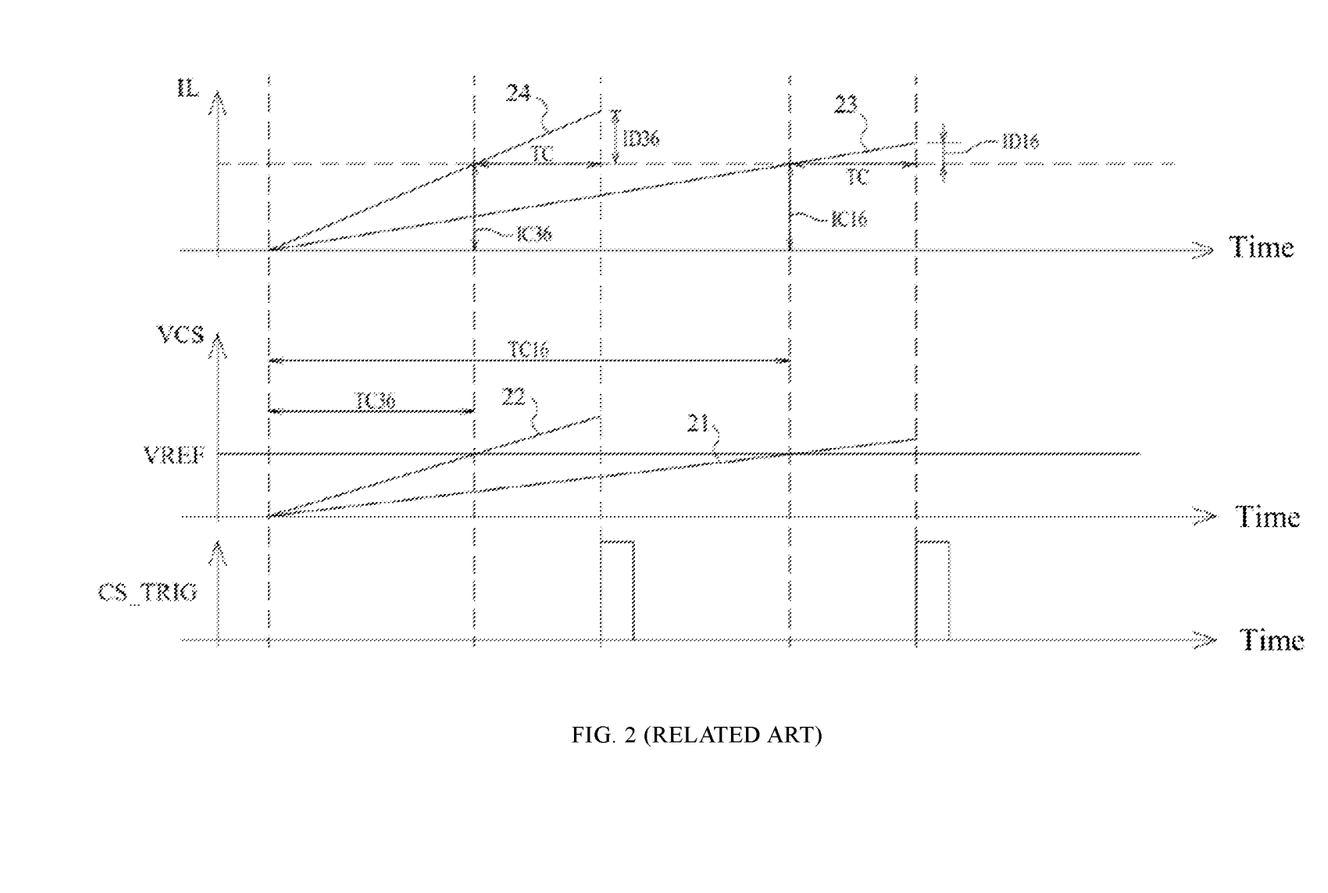
FIG. 2 is a signal waveform diagram of a DC-DC converter using an inductive current sensor of the prior art.

Referring to FIG. 1 and FIG. 2 at the same time, FIG. 2 is a signal waveform diagram of a DC-DC converter using an inductive current sensor of the prior art. In FIG. 2, curves of the inductor current are curve 23 and 24 respectively when the input voltages are 1.6 volts and 3.6 volts. Moreover, curves of the sensing voltage VCS are curve 21 and 22 respectively when the input voltages are 1.6 volts and 3.6 volts. TC indicates a propagation delay time of the comparator. When the sensing voltage VCS is equal to the reference voltage, the triggering signal output by the comparator is a high logic level, but delayed for the propagation delay time TC. TC16 is an inductor charge time that the sensing voltage VCS is charged from 0 V to the reference voltage VREF when the input voltage is 1.6 V. Also, TC36 is an inductor charge time that the sensing voltage VCS is charged from 0 V to the reference voltage VREF when the input voltage is 3.6 V. IC16 is a charge current value of the inductor current obtained after the inductor is charged for the inductor charge time TC16 when the input voltage is 1.6 V. Also, IC36 is a charge current value of the inductor current obtained after the inductor is charged for the inductor charge time TC36 when the input voltage is 3.6 V. ID16 is an offset current value of the inductor current due to the existence of the propagation delay time TC when the input voltage is 1.6 V. ID36 is an offset current value of the inductor current due to the existence of the propagation delay time TC when the input voltage is 3.6 V.

Referring to the signal waveform diagram of FIG. 2, a peak value IPEAK=ICH+ID of the inductor current can be obtained. ICH is a charge current value of the inductor current obtained after the inductor is charged for the inductor charge time. Further, ID is an offset current value of the inductor current. For example, when the input voltages are 1.6 V and 3.6 V, the peak values IPEAK of the inductor current are IC16+ID16 and IC36+ID36 respectively. In this example, ICH=TC·(VIN−VOUT)/L, and ID=TC·(VIN−VOUT)/L. L is an inductor value, and VOUT is an output voltage.

As the inductor current increases, the sensing voltage VCS also increases. Although the inductor charge times TC16 and TC36 are different from each other when the sensing voltage VCS is charged from 0 V to the reference voltage. However, the charge current values IC16 and IC36 of the inductor current obtained after the inductor is charged for the inductor charge times TC16 and TC36 are the same. When the sensing voltage VCS is risen to the reference voltage, the triggering signal generated by the comparator is the high logic level, but it has the propagation delay time TC. As a result, the peak value of the inductor current has the additional offset current value ID. Since the offset current value ID is related to the input voltage VIN, and the propagation delay time TC does not vary with the input voltage VIN, the offset current values ID16 and ID36 are different from each other. Besides, the offset current value ID36 is greater than the offset value ID16.

Simply speaking, in the prior art, the constant peak current circuit of the inductive current sensor 1 cannot make the peak value of the inductor current generated by the DC-DC conversion apparatus not vary due to the change of the input voltage, and the peak value of the inductor current output may not be constant.

SUMMARY

According to the purpose of the present disclosure, an embodiment of the present disclosure provides an inductive current sensor. The inductive current sensor is configured for a constant peak current circuit of a DC-DC conversion apparatus, and comprises a sampling unit, a voltage-voltage conversion unit and an input compensation unit. The sampling unit is configured to generate a sampling voltage inversely proportional to an inductor current output by the DC-DC conversion apparatus. The voltage-voltage conversion unit is electrically connected to the sampling unit, and configured to receive the sampling voltage, and to generate a sensing voltage inversely proportional to the sampling voltage. The input voltage compensation unit is electrically connected to the voltage-voltage conversion unit, and configured to receive an input voltage to provide an initial voltage level of the sensing voltage. Moreover, the initial voltage level is proportional to the input voltage.

According to the purpose of the present disclosure, an embodiment of the present disclosure provides an inductive current sensor. The inductive current sensor is configured for a constant peak current circuit of a DC-DC conversion apparatus, and comprises a sampling unit, a voltage-voltage conversion unit and an input voltage compensation unit. The sampling unit is configured to generate a sampling voltage, wherein the sampling voltage is related to an inductor current output by the DC-DC conversion apparatus. The voltage-voltage conversion unit is electrically connected to the sampling unit, and configured to receive the sampling voltage, and to generate a sensing voltage at a first resistor of the voltage-voltage conversion unit. The input voltage compensation unit is electrically connected to the voltage-voltage conversion unit, and configured to receive an input voltage. The input voltage compensation unit divides the input voltage through a second resistor and the first resistor to provide an initial voltage level of the sensing voltage, so as to reduce an inductor charge time which does not comprise a propagation delay time.

According to the purpose of the present disclosure, an embodiment of the present disclosure provides a constant peak current circuit. The constant peak current circuit is configured for a DC-DC conversion apparatus, and comprises any of the aforementioned inductive current sensors and a comparator. The comparator is electrically connected to the inductive current sensor, and configured to compare the sensing voltage of the inductive current sensor with a reference voltage and output a triggering signal accordingly.

According to the purpose of the present disclosure, an embodiment of the present disclosure provides a DC-DC conversion apparatus. The DC-DC conversion apparatus comprises the aforementioned constant peak current circuit, a controller and a DC-DC converter. The controller is electrically connected to the constant peak current circuit, and configured to receive the triggering signal to generate a control signal. The DC-DC converter is electrically connected to the controller, and configured to receive the control signal to generate the inductor current.

In conclusion, the embodiments of the present disclosure provide the inductive current sensor for the constant peak current circuit of the DC-DC conversion apparatus. The inductive current sensor can make the peak value of the inductor current output by the DC-DC conversion apparatus not vary with the change of the input voltage.

To further understand the technology, means, and effects of the present disclosure, reference may be made by the detailed description and drawing as follows. Accordingly, the purposes, features and concepts of the present disclosure can be thoroughly and concretely understood. However, the following detailed description and drawings are only used to reference and illustrate the implementation of the present disclosure, and they are not used to limit the present disclosure.

BRIEF DESCRIPTION OF THE DRAWINGS

The accompanying drawings are provided to enable person having ordinary skill in the art can further understand the present disclosure, and the accompanying drawings are incorporated in and constitute a part of the specification of the present disclosure. The drawings illustrate exemplary embodiments of the present disclosure, and the description in the specification of the present disclosure is served to explain together the principal of the present disclosure.

DESCRIPTION OF THE PREFERRED EMBODIMENTS

Now, reference will be made in detail to exemplary embodiments of the present disclosure, exemplary embodiments of which are illustrated in the accompanying drawings. In the case of possibility, the same reference numbers will be used in the drawings and the description to refer the same or similar parts. In addition, the practice of the exemplary embodiments is only one implementation of the design concept of the present disclosure, and the following exemplary embodiments are not intended to limit the present disclosure.

An embodiment of the present disclosure provides a constant peak current circuit, which adopts an inductive current sensor that can compensate the change of an input voltage. Consequently, a peak value of an inductor current generated by the DC-DC conversion apparatus using the constant peak current circuit does not vary with the different input voltages. As a result, the peak value of the inductor current of the DC-DC converter is the same whether the input voltage is 1.6 V or 3.6 V. Briefly, the purpose of the present disclosure is how to eliminate the influence of the input voltage on the peak value of the inductor current of the DC-DC converter.

Figure 3:
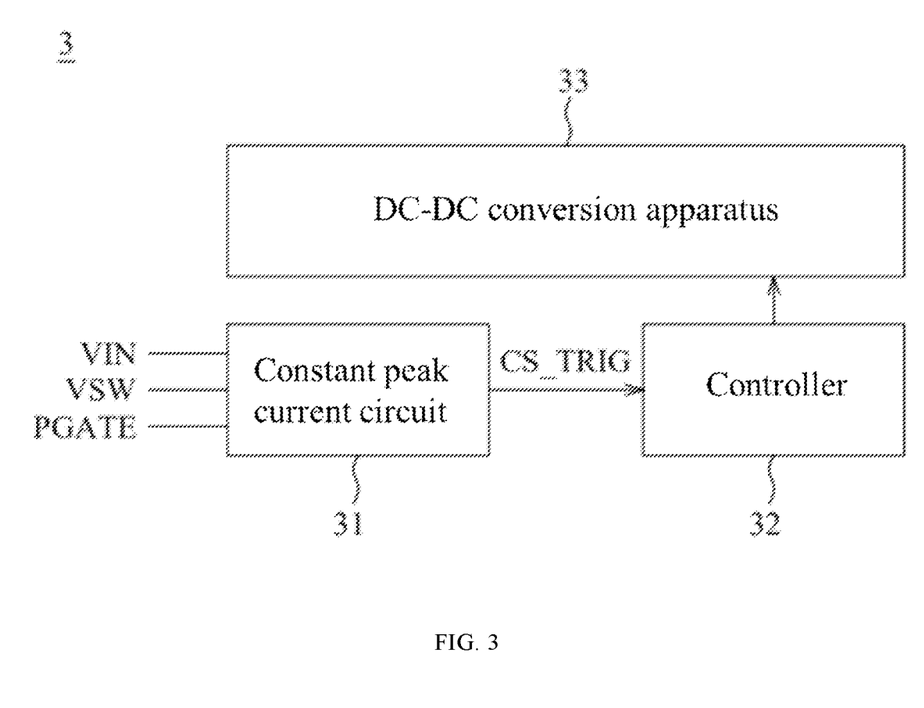
FIG. 3 is a functional block diagram of a DC-DC conversion apparatus according to an embodiment of the present disclosure.

Referring to FIG. 3, FIG. 3 is a functional block diagram of a DC-DC conversion apparatus according to an embodiment of the present disclosure. The DC-DC conversion apparatus 3 comprises a constant peak current circuit 31, a controller 32 and a DC-DC converter 33. The controller 32 is electrically connected to the constant peak current circuit 31 and the DC-DC converter 33. The constant peak current circuit 31 is configured to receive a gate signal PGATE, an input voltage VIN and a feedback voltage VSW. Besides, the feedback VSW is related to an inductor current of the DC-DC converter 33, and inversely proportional to the inductor current. The gate signal PGATE is configured to control whether to turn on the constant peak current circuit 31. Also, the constant peak current circuit 31 is configured to generate a triggering signal CS_TRIG to the controller 32 according to the feedback voltage VSW and the input voltage VIN after the constant peak current circuit 31 is turned on.

The controller 32 is configured to generate a control signal according to the triggering signal CS_TRIG to control the switching of an internal switch of the DC-DC converter 33, so that the DC-DC converter 33 generates the corresponding inductor current. Through the use of the constant peak current circuit 31, the peak value of the inductor current generated by the DC-DC converter 33 does not vary with the input voltage VIN. That is, regardless of the volts of the input voltage VIN, the constant peak current circuit 31 makes the peak value of the inductor current generated by the DC-DC converter 33 be a constant peak. Additionally, the DC-DC converter 33 may be a buck converter or a boost converter, and the present disclosure is not limited thereto.

Figure 4:
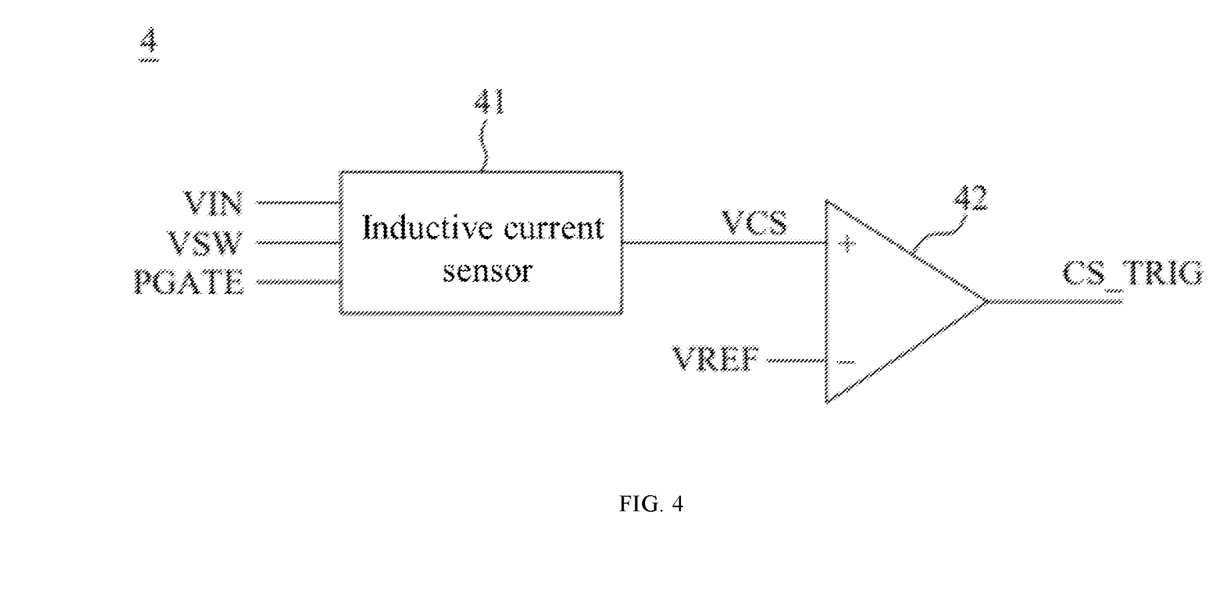
FIG. 4 is a functional block diagram of a constant peak current circuit according to an embodiment of the present disclosure.

Referring to FIG. 4 of the present disclosure, FIG. 4 is a functional block diagram of a constant peak current circuit according to an embodiment of the present disclosure. The constant peak current circuit of FIG. 3 can be implemented by the constant peak current circuit 4 of the FIG. 4, but the present disclosure is not limited thereto. The constant peak current circuit 4 comprises an inductive current sensor 41 and a comparator 42. The inductive current sensor 41 is electrically connected to the comparator 42. The gate signal PGATE is configured to control whether to turn on the inductive current sensor 41. Moreover, the sensing voltage VCS is generated according to the input voltage VIN and the feedback voltage VSW after the inductive current sensor 41 is turned on.

The comparator 42 is configured to compare the sensing voltage VCS with a reference voltage VREF to generate the triggering signal CS_TRIG. The sensing voltage VCS generated by the inductive current sensor 41 has different initial voltage levels corresponding to the different levels of the input voltage VIN (the higher input voltage VIN, the higher initial voltage level). Thus, the present disclosure is not the same as the prior art, the sensing voltage VCS rises with the identical voltage level regardless of the input voltage. In this way, taking the variation of the input voltage VIN into account, the peak value of the inductor current generated by the DC-DC converter 33 is designed to be a constant peak value, which does not vary with the different levels of the input voltage VIN.

Figure 5:
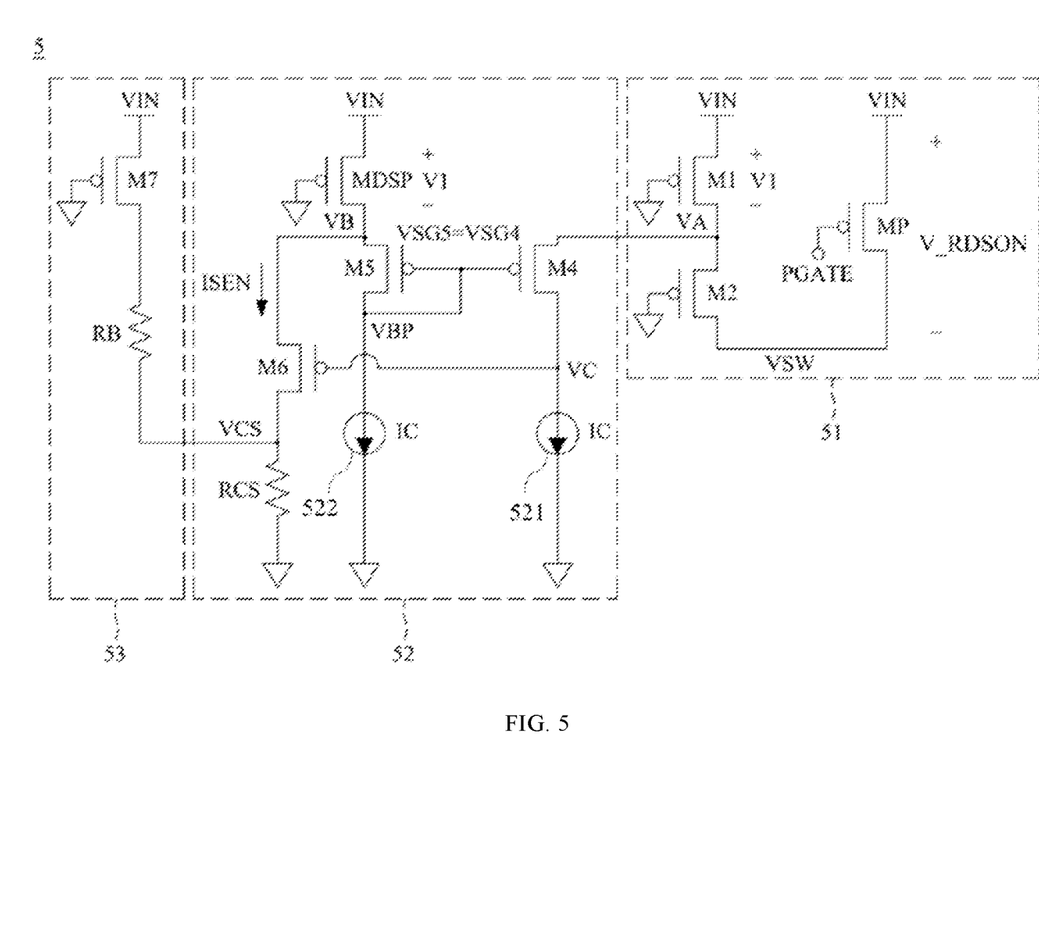
FIG. 5 is a circuit diagram of an inductive current sensor according to an embodiment of the present disclosure.

Next, referring to FIG. 5, FIG. 5 is a circuit diagram of an inductive current sensor according to an embodiment of the present disclosure. The inductive current sensor 41 of FIG. 4 can be implemented by the inductive current sensor 5 of FIG. 5, and the present disclosure is not limited thereto. The inductive current sensor 5 comprises a sampling unit 51, a voltage-voltage conversion unit 52 and an input voltage compensation unit 53. The voltage-voltage conversion unit 52 is electrically connected to the input voltage compensation unit 53.

The sampling unit 51 is configured to receive the gate signal PGATE, the input voltage VIN and the feedback VSW. The gate signal PGATE is configured to control whether the sampling unit 51 generates the sampling voltage VA according to the inductor current. Further, the gate signal PGATE is configured to control whether the sampling unit 51 samples the feedback VSW. Also, the sampling unit 51 is configured to sample the feedback voltage VSW to output the sampling voltage VA after the sampling unit 51 is turned on. The sampling voltage VA is proportional to the feedback voltage VSW. That is, the lower feedback voltage VSW is, the lower sampling voltage VA is. More, the feedback voltage VSW is inversely proportional to the inductor current of the DC-DC converter 33.

The voltage-voltage conversion unit 52 is configured to receive the sampling voltage VA and the input voltage VIN, and to generate the sensing voltage VCS according to the sampling voltage VA. Besides, the sensing voltage VCS is inversely proportional to the sampling voltage VA. The input voltage compensation unit 53 is configured to receive the input voltage VIN, and to generate a DC compensation voltage according to the input voltage VIN to rise the initial voltage level of the sensing voltage VCS. Moreover, the higher input voltage VIN is, the higher initial voltage level of the sensing voltage VCS is. In an embodiment of the present disclosure, the resistance value of a resistor RB in the input voltage compensation unit 53 is proportional to the reciprocal of the propagation delay time of the comparator 42. Also, the resistance value of the resistor RB in the input voltage compensation unit 53 is inversely proportional to the resistance value of a resistor RCS of the voltage-voltage conversion unit 52, wherein the resistance value of a resistor RCS of the voltage-voltage conversion unit 52 is used for generating the sensing voltage VCS. Therefore, with proper design, the peak value of the inductor current generated by the DC-DC converter using the inductive current sensor 5 is a constant peak value.

In an embodiment of the present disclosure, the sampling unit 51 comprises transistors MP, M1 and M2. The transistors MP, M1 and M2 are P-type metal oxide semiconductor (MOS) transistors. Sources of the transistors MP and M1 are configured to receive the input voltage VIN. A gate of the transistor MP is configured to receive the gate signal PGATE. Drains of the transistors MP and M2 are configured to receive the feedback voltage VSW. Gates of the transistors M1 and M2 are electrically connected to a ground voltage. A drain of the transistor M1 is electrically connected to a source of the transistor M2. There are on-resistors formed in the transistors M1, M2 and MP when the transistors M1, M2 and MP are turned on. Hence, there is a voltage V_RDSOM between the source and the drain of the transistor MP, and there is a voltage V1 between the source and the drain of the transistor M1. The feedback voltage VSW is associated to the inductor current of the DC-DC converter, and inversely proportional to the inductor current. That is, the higher inductor current, the lower feedback voltage VSW is. When the transistor MP is turned off, the sampling voltage VA decreases with the decrease of the feedback voltage VSW in proportional to the ratio of the on-resistors of the transistors M1 and M2. That is, when the feedback voltage VSW becomes lower, the sampling voltage VA becomes lower.

The voltage-voltage conversion unit 52 comprises a plurality of transistors MDSP, M4, M5, M6, the resistor RCS, current sources 521 and 522. The plurality of transistors MDSP, M4, M5 and M6 are P-type MOS transistors. A gate of the transistor MDSP is electrically connected to the ground voltage. A source of the transistor MDSP is configured to receive the input voltage VIN. A drain of the transistor MDSP is electrically connected to sources of the transistors M5 and M6. Gates of the transistors M4 and M5 are electrically connected to each other, and the gate of the transistor M4 is also electrically connected to a drain of the transistor M5 and a first end of the current source 522. A source of the transistor M4 is configured to receive the voltage VA output by the sampling unit 51. Then, a drain of the transistor M4 is electrically connected to a gate of the transistor M6 and a first end of the current source 521. Second ends of the current sources 521 and 522 are electrically connected to the ground voltage. A first end of the resistor RCS is electrically connected to a drain of the transistor M6, and a second end of the resistor RCS is electrically connected to the ground voltage. Also, the first end of the resistor RCS is configured to generate the sensing voltage VCS.

In addition, the input voltage compensation unit 53 comprises a transistor M7 and the resistor RB. The transistor M7 is a P-type MOS transistor. The transistor M7 is configured to receive the input voltage VIN, and a gate of the transistor M7 is electrically connected to the ground voltage. A first end of the resistor RB is electrically connected to a drain of the transistor M7, and a second end of the resistor RB is electrically connected to an end (i.e., the first end of the resistor RCS) of the voltage-voltage conversion unit 52, wherein the end of the voltage-voltage conversion unit 52 is used for generating the sensing voltage VCS.

In the off state, the transistors MP, M1, M2, M7 and MDSP are turned on. Therefore, the voltages VA and VB at the internal nodes are reset to high voltage (for example, the input voltage VIN), and the voltages VB and VBP at the internal nodes are reset to low voltage (for example, the ground voltage). In the on state, the transistor MP is turned off and the transistors M1, M2, M7 and MDSP are turned on. The voltages VA, VB, VC and VBP at the internal nodes are established. Moreover, when the transistors MP, M1 and MDSP are turned on, there are the on-resistors formed in the transistors MP, M1 and MDSP. As a result, there is the voltage V_RDSOM between the source and the drain of the transistor MP, there is the voltage V1 between the source and the drain of the transistor M1, and there is the voltage V1 between the source and the drain of the transistor MDSP.

Furthermore, the voltage VA is established due to the on-resistors of the transistors M1 and M2. The voltage VB tracks the voltage VA through a common-gate comparator formed by the transistors M4 and M5. The voltage VBP is risen to an operating voltage through the current IC provided by the current source 522. The voltage VA, VB and VBP at the nodes are risen to the operating voltage, and the inductive current sensor 5 starts to sense the inductor current. At present, a source-gate voltage VSG4 of the transistor M4 is equal to a source-gate voltage VSG5 of the transistor M5. When the inductor current increases, the feedback voltage VSW decreases. Also, the voltage VA decreases with the decrease of the feedback voltage VSW in proportional to the on-resistors of the transistors M1 and M2. Through the transistor M4, the voltage VC decreases based on the decrease of the voltage VA. As the voltage VC decreases, the transistor M6 is turned on to charge the resistor gradually through an inductor current ISEN, and the sensing voltage VCS is generated accordingly. The transistor M7 divides the input voltage VIN through the resistors RB and RCS to compensate the sensing voltage VCS.

When the inductor current is much higher than the current IC, the sensing voltage VCS can be expressed as $$VCS=(\alpha IL-IC)\cdot RCS+VIN\cdot[RCS/(RCS+RB)], \text{ and}$$

$$\alpha=\{(W2/L2)/[(W1/L1)+(W2/L2)]\}\cdot(RDSON/RDSP).$$

IL is a current value of the inductor current. W1 is a channel width of the transistor M1, and L1 is a channel length of the transistor M1. W2 is a channel width of the transistor M2, and L2 is a channel length of the transistor M2. RDSON is the on-resistor of the transistor MP, and RDSP is the on-resistor of the transistor MDSP.

Figure 6:
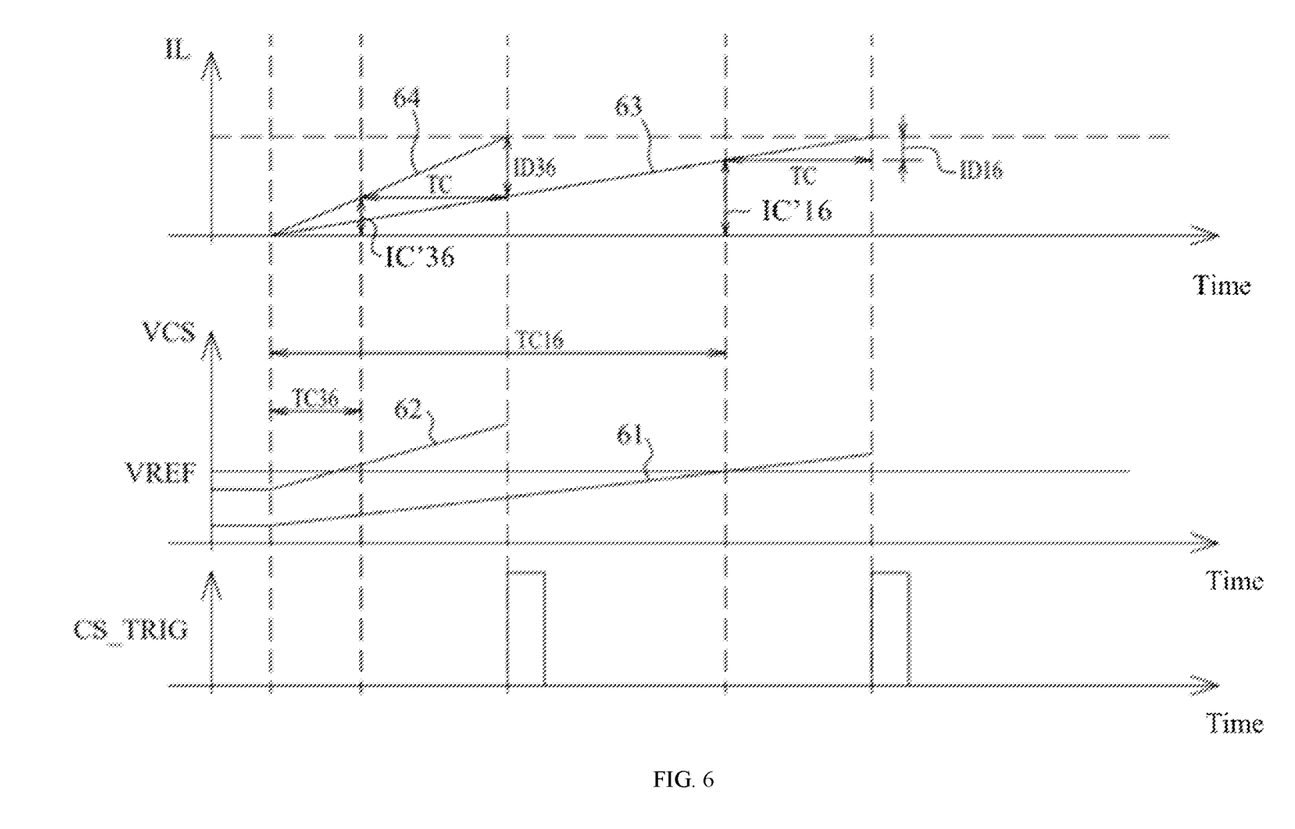
FIG. 6 is a signal waveform diagram of a DC-DC conversion apparatus according to an embodiment of the present disclosure.

Referring to FIG. 5 and FIG. 6, FIG. 6 is signal waveform diagram of a DC-DC conversion apparatus according to an embodiment of the present disclosure. In FIG. 5, curves of the inductor current are curve 63 and 64 respectively when the input voltages are 1.6 volts and 3.6 volts. Also, curves of the sensing voltage VCS are curve 61 and 62 respectively when the input voltages are 1.6 volts and 3.6 volts. TC indicates the propagation delay time of the comparator. When sensing voltage VCS is equal to the reference voltage, the triggering signal output by the comparator is high logic level, but delayed for the propagation time. TC16 is an inductor charge time that the sensing voltage is charged from 0 V to the reference voltage VREF when the input voltage is 1.6 volts. TC36 is an inductor charge time that the sensing voltage is charged from 0 V to the reference voltage VREF when the input voltage is 3.6 V. IC'16 is a charge current value of the inductor current obtained after the inductor is charged for the inductor charge time TC16 when the input voltage is 1.6 volts. IC'36 is a charge current value of the inductor current obtained after the inductor is charged for the inductor charge time TC36 when the input voltage is 3.6 volts. ID16 is an offset current value of the inductor current generated due to the existence of the propagation delay time TC when the input voltage is 1.6 volts. ID36 is an offset current value of the inductor current generated due to the existence of the propagation delay time TC when the input voltage is 3.6 volts.

It can be seen from the signal waveform diagram of FIG. 6 that the peak value IPEAK=I'CH+ID of the inductor current can be obtained. I'CH is a charge current value of the inductor current obtained after the inductor is charged for the inductor charge time, and ID is an offset current value of the inductor current. For example, the peak value IPEAK of the inductor current is IC'16+ID16 when the input voltage is 1.6 volts. Also, the peak value IPEAK of the inductor current is IC'36+ID36 when the input voltage is 3.6 volts.

In this example, I'CH=(1/α·RCS)·{VREF−VIN·[RCS/(RCS+RB)]}, and ID=TC·(VIN−VOUT)/L. L is an inductor value, and VOUT is an output voltage.

To have the peak value of the inductor current be a constant value, IC'16+ID16=IC'36+ID36 is made, and the formula will be obtained as follows.

(1/α·RCS){VREF−VIN36·[RCS/(RCS+RB)]}+TC·
(VIN36−VOUT)/L=(1/α·RCS)·{VREF−VIN16·
[RCS/(RCS+RB)]}+TC·(VIN16−VOUT)/L

VIN36 indicates the input voltage is 3.6 volts, and VIN 16 indicates the input voltage 1.6 volts. The preceding formula is rearranged, (1/L)·(TC·VIN36−TC·VIN16)−(VOUT·TC−VOUT·TC)=(1/α)·(VIN36−VIN16)·1/(RCS+RB) can be obtained. As a result, RB=[L/(α·TC)]−RCS can be deduced finally. Simply speaking, as long as the resistance of the resistor RB or the resistance value of the resistor RCS is designed to meet the equation RB=[L/(α·TC)]−RCS. Then, the peak value of the inductor current can be a constant value, and the peak value does not vary with the change of the input voltage.

Consequently, no matter whether the input voltage is 1.6 volts or 3.6 volts, the peak value of the inductor current of the DC-DC conversion apparatus using the inductive current sensor of the embodiments of the present disclosure is the same. Besides, through experiments and simulations, in the prior art, the peak difference (i.e., a zero-point current difference) corresponding to the input voltage of 3.6 volts and 1.6 volts is 43 mA when using the manner of the inductive current sensor. In the embodiments of the present disclosure, the peak difference (i.e., the zero-point current difference) corresponding to the input voltage of 3.6 volts and 1.6 volts is 6 mA. Obviously, the inductive current sensor of the embodiments of the present disclosure can improve the zero-current difference by as much as 86%.

As the state above, the embodiments of the present disclosure provide an inductive current sensor for a constant peak current circuit of a DC-DC conversion apparatus. The inductive current sensor is mainly configured to directly compensate the sensing voltage generated by the inductor current after the input voltage is divided. When the input voltage is higher, the initial voltage level of the sensing voltage is higher. Hence, the sensing voltage can be risen to the reference voltage early to reduce the charge current value of the inductor current, so as to make the peak value of the inductor current output by the DC-DC conversion apparatus not vary with the change of the input voltage.

It should be understood that the examples and embodiments described herein are for illustrative purpose only, and various modifications or changes in view thereof will be suggested to those skilled in the art, and will be included in the spirit and scope of the application and the appended within the scope of the claims.

What is claimed is:

1. An inductive current sensor which is configured for a constant peak current circuit of a DC-DC conversion apparatus, comprising:
   a sampling unit, configured to generate a sampling voltage inversely proportional to an inductor current output from the DC-DC conversion apparatus;
   a voltage-voltage conversion unit, electrically connected to the sampling unit, and configured to receive the sampling voltage and generate a sensing voltage inversely proportional to the sampling voltage; and
   an input voltage compensation unit, electrically connected to the voltage-voltage conversion unit, and configured to receive an input voltage to provide an initial voltage level of the sensing voltage, wherein the initial voltage level is proportional to the input voltage,
   wherein the sampling unit is further configured to receive a feedback voltage and the input voltage, and generate the sampling voltage proportional to the feedback voltage, wherein the feedback voltage is related and inversely proportional to the inductor current output from the DC-DC conversion apparatus, and
   wherein the sampling unit comprises a first transistor, a second transistor and a third transistor, wherein sources of the first transistor and the third transistor receive the input voltage, gates of the first transistor and the second transistor are electrically connected to a ground voltage, a gate of the third transistor receives a gate control signal, a drain of the first transistor and a source of the second transistor are electrically connected to each other and configured to output the sampling voltage, and drains of the second transistor and the third transistor are electrically connected to each other and configured to receive the feedback voltage.

2. The inductive current sensor according to claim 1, wherein the voltage-voltage conversion unit comprises a first resistor, the input voltage compensation unit comprises a second resistor, one end of the first resistor is electrically connected to one end of the second resistor and configured to generate the sensing voltage, and a resistance value of the second resistor is inversely proportional to a resistance value of the first resistor.

3. The inductive current sensor according to claim 2, wherein the voltage-voltage conversion unit further comprises a first current source, a second current source, a fourth transistor, a fifth transistor, a sixth transistor and a seventh transistor, wherein a source of the fourth transistor receives the sampling voltage, a gate of the fourth transistor is electrically connected to a gate and a drain of the fifth transistor, a first end of the first current source is electrically connected to a drain of the fourth transistor, a first end of the second current source is electrically connected to a drain of the fifth transistor, second ends of the first current source and the second current source are electrically connected to a ground voltage, a gate of the seventh transistor is electrically connected to the ground voltage, a source of the seventh transistor receives the input voltage, a drain of the seventh transistor is electrically connected to sources of the fifth transistor and the sixth transistor, a gate of the sixth transistor is electrically connected to a drain of the fourth transistor, a first end of the first resistor is electrically connected to a drain of the sixth transistor, and a second end of the first resistor is electrically connected to the ground voltage.

4. The inductive current sensor according to claim 3, wherein the input voltage compensation unit further comprises an eighth transistor, wherein a source of the eighth transistor receives the input voltage, a gate of the eighth transistor is electrically connected to the ground voltage, a first end of the second resistor is electrically connected to a drain of the eighth transistor, and a second end of the second resistor is electrically connected to the first end of the first resistor.

5. A constant peak current circuit which is configured for a DC-DC conversion apparatus, comprising:
   an inductive current sensor, comprising:
      a sampling unit, configured to generate a sampling voltage inversely proportional to an inductor current output by the DC-DC conversion apparatus;
      a voltage-voltage conversion unit, electrically connected to the sampling unit, and configured to receive the sampling voltage and generate a sensing voltage inversely proportional to the sampling voltage accordingly; and an input voltage compensation unit, electrically connected to the voltage-voltage conversion unit, and configured to receive an input voltage to provide an initial voltage level of the sensing voltage, wherein the initial voltage level is proportional to the input voltage; and a comparator, electrically connected to the inductive current sensor, and configured to compare the sensing voltage of the inductive current sensor with a reference voltage and output a triggering signal accordingly, wherein the sampling unit is further configured to receive a feedback voltage and the input voltage, and generate the sampling voltage proportional to the feedback voltage, wherein the feedback voltage is related and inversely proportional to the inductor current the DC-DC conversion apparatus, and wherein the sampling unit comprises a first transistor, a second transistor and a third transistor, wherein sources of the first transistor and the third transistor receive the input voltage, gates of the first transistor and the second transistor are electrically connected to a ground voltage, a gate of the third transistor receives a gate control signal, a drain of the first transistor and a source of the second transistor are electrically connected to each other and configured to output the sampling voltage, and drains of the second transistor and the third transistor are electrically connected to each other and configured to receive the feedback voltage.

6. The constant peak current circuit according to claim 5, wherein the voltage-voltage conversion unit comprises a first resistor, the input voltage compensation unit comprises a second resistor, one end of the first resistor is electrically connected to one end of the second resistor and configured to generate the sensing voltage, and a resistance value of the second resistor is inversely proportional to a resistance value of the first resistor.

7. The constant peak current circuit according to claim 6, wherein the voltage-voltage conversion unit further comprises a first current source, a second current source, a fourth transistor, a fifth transistor, a sixth transistor and a seventh transistor, wherein a source of the fourth transistor receives the sampling voltage, a gate of the fourth transistor is electrically connected to a gate and a drain of the fifth transistor, a first end of the first current source is electrically connected to a drain of the fourth transistor, a first end of the second current source is electrically connected to a drain of the fifth transistor, second ends of the first current source and the second current source are electrically connected to a ground voltage, a gate of the seventh transistor is electrically connected to the ground voltage, a source of the seventh transistor receives the input voltage, a drain of the seventh transistor is electrically connected to sources of the fifth transistor and the sixth transistor, a gate of the sixth transistor is electrically connected to a drain of the fourth transistor, a first end of the first resistor is electrically connected to a drain of the sixth transistor, and a second end of the first resistor is electrically connected to the ground voltage.

8. The constant peak current circuit according to claim 7, wherein the input voltage compensation unit further comprises an eighth transistor, wherein a source of the eighth transistor receives the input voltage, a gate of the eighth transistor is electrically connected to the ground voltage, a first end of the second resistor is electrically connected to a drain of the eighth transistor, and a second end of the second resistor is electrically connected to the first end of the first resistor.

* * * * *